US012675049B2

(12) United States Patent
Karawajczyk

(10) Patent No.: US 12,675,049 B2
(45) Date of Patent: Jul. 7, 2026

(54) MULTI HEAD SCANNING LITHOGRAPHIC LASER WRITER AND A METHOD FOR OPERATING

(71) Applicant: Mycronic AB, Taby (SE)

(72) Inventor: Andrzej Karawajczyk, Stockholm (SE)

(73) Assignee: Mycronic AB, Taby (SE)

( * ) Notice: Subject to any disclaimer, the term of this patent is extended or adjusted under 35 U.S.C. 154(b) by 173 days.

(21) Appl. No.: 18/700,464

(22) PCT Filed: Nov. 15, 2022

(86) PCT No.: PCT/EP2022/081883
§ 371 (c)(1),
(2) Date: Apr. 11, 2024

(87) PCT Pub. No.: WO2023/088862
PCT Pub. Date: May 25, 2023

(65) Prior Publication Data
US 2024/0411231 A1    Dec. 12, 2024

(30) Foreign Application Priority Data
Nov. 16, 2021    (EP) ..................................... 21208381

(51) Int. Cl.
*G03F 7/00* (2006.01)
*G02F 1/29* (2006.01)
*G02F 1/33* (2006.01)
(52) U.S. Cl.
CPC .............. *G03F 7/704* (2013.01); *G02F 1/292* (2013.01); *G02F 1/332* (2013.01); *G03F 7/70025* (2013.01)
(58) Field of Classification Search
None
See application file for complete search history.

(56) References Cited

U.S. PATENT DOCUMENTS 6,521,866 B1 * 2/2003 Arai ................... B23K 26/0622
                                                   219/121.73
10,451,953 B2 * 10/2019 Peled ....................... G02F 1/11
(Continued)

FOREIGN PATENT DOCUMENTS

WO        2020120725 A1    6/2020

OTHER PUBLICATIONS

Thomas W. Jarvis, Mulitplexing acousto-optical modulators to steer polychromatic lasers, Jan. 2015, Optica Publishing Group, vol. (Year: 2015).*

(Continued)

*Primary Examiner* — Leslie J Evanisko
*Assistant Examiner* — Samuel Frederick Boelitz
(74) *Attorney, Agent, or Firm* — Harness, Dickey & Pierce, P.L.C.

(57)        ABSTRACT

A scanning lithographic laser writer, comprises a substrate holder, an irradiation arrangement and a control unit. The irradiation arrangement has a laser source, a multi head modulator arrangement and at least two writing head arrangements. The irradiation arrangement is arranged for providing laser light, via the multi head modulator arrangement to the writing head arrangements to irradiate a substrate plane. The control unit is configured for controlling a relative mechanical displacement between a substrate holder and the writing head arrangements, and for controlling a sweep of laser light exiting therefrom. The multi head modulator arrangement is configured to split and modulate an input beam into at least one modulated beam for each of the writing head arrangements by use of an acoustic-optical crystal. The writing head arrangements are positioned to displace laser light exiting from the writing head arrangements with respect to each other.

20 Claims, 10 Drawing Sheets

(56)         References Cited

U.S. PATENT DOCUMENTS

| | | | |
|---|---|---|---|
| 2009/0273793 A1 | 11/2009 | Fukuda et al. | |
| 2020/0166852 A1 | 5/2020 | Richter et al. | |
| 2020/0192183 A1* | 6/2020 | Svensson | G02F 1/332 |

OTHER PUBLICATIONS

International Search Report for International Application No. PCT/EP2022/081883 dated Feb. 23, 2023.

European Search Report For European Patent Application No. PCT/EP2022/081883 dated Nov. 5, 2022.

* cited by examiner

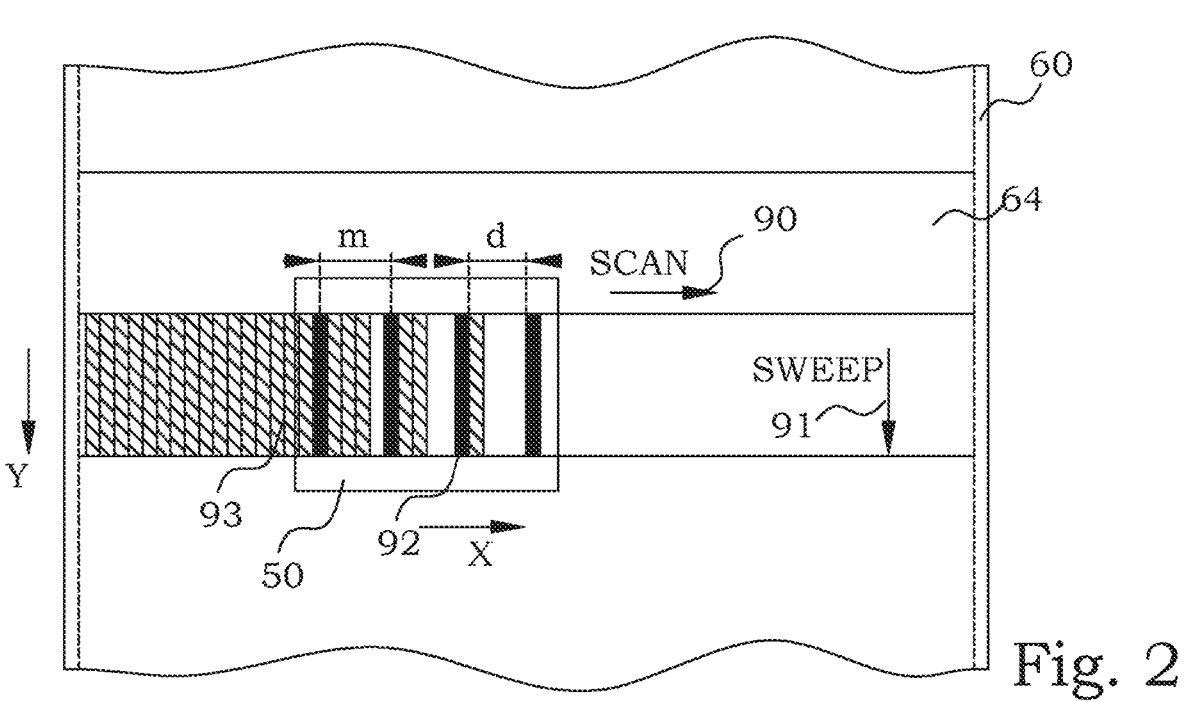
Fig. 2
Fig. 5
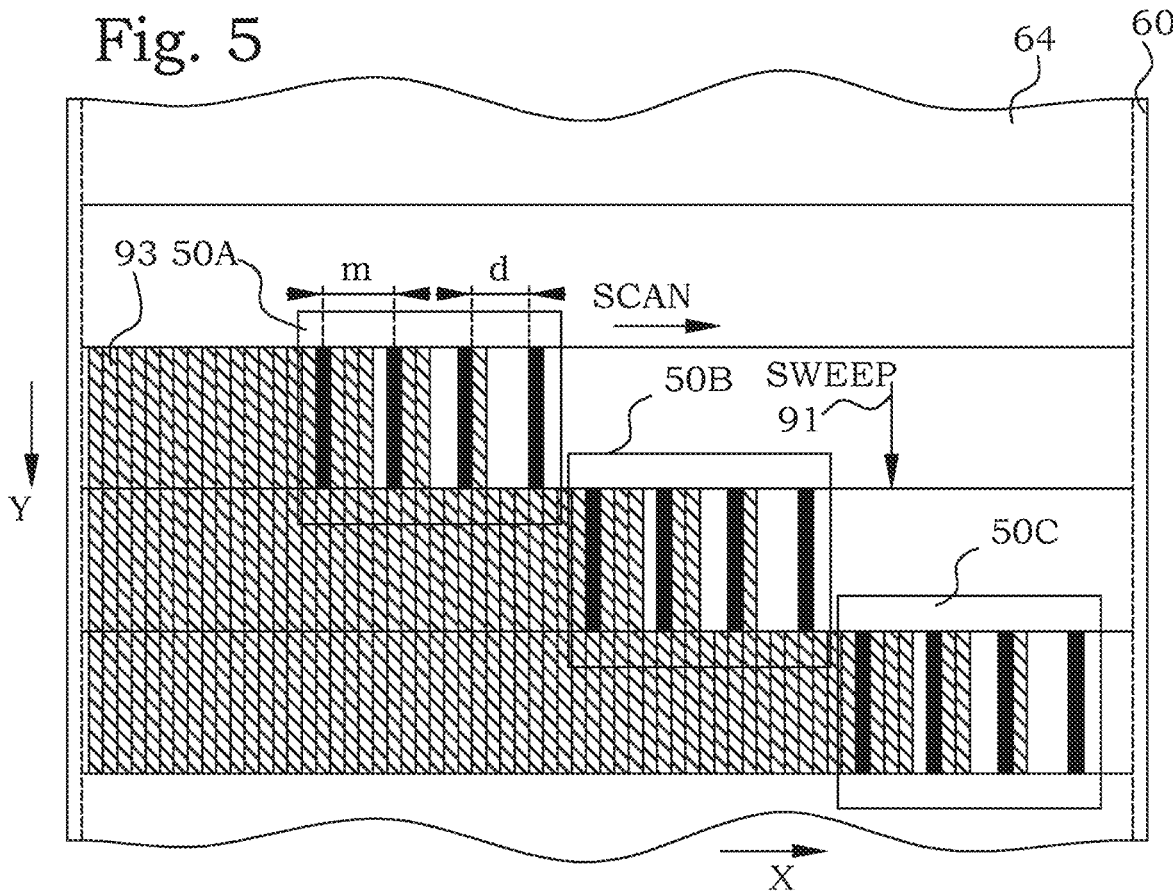

MULTI HEAD SCANNING LITHOGRAPHIC LASER WRITER AND A METHOD FOR OPERATING

This application is a national phase under 35 U.S.C. § 371 of PCT International Application No. PCT/EP2022/081883 which has an International filing date of Nov. 15 2022, which claims priority to European Application No. 21208381.0, filed Nov. 16, 2021 the entire contents of each of which are hereby incorporated by reference.

TECHNICAL FIELD

The present technology refers in general to lithographic writers, and in particular to scanning lithographic laser writers and methods for operating scanning lithographic laser writers.

BACKGROUND

All currently commercially available laser maskwriters are equipped with a single final lens. In this single head design, the light is delivered to the reticle through an optomechanical assembly called a printing head. The printing head is thus equipped to influence one or a multitude of modulated laser beams with a common single final lens. The laser beam(s) is(are) focused by this lens to a respective small spot. The position of this spot is typically rapidly and periodically changing causing the beam trajectory to form one line (or a multitude of parallel lines) of laser light under the final lens. This is typically referred to as a sweep and the direction of the sweep is often denoted as the Y direction. In some devices, the printing head assembly moves in the respect to the reticle in the direction transverse to the sweep direction. This moving direction is often denoted as the X direction. In other devices, the reticle is instead being moved in respect to the printing head assembly. The relative edge-to-edge travel is named the X stroke and the length of the abovementioned line under the single final lens is typically called a sweep. Both these design solutions result in the reticle being sequentially, stroke by stroke, exposed to an intensity modulated light yielding in the patterned mask. If a multitude of beams are used with the common single final lens, the parallel lines thereof are offset in the X direction.

This writing concept sets the limits for the printing speed of the writer. Given a certain speed of the X stage or alternatively of the printing head under the X stroke as well as the length of the X stroke, and the number of beams in the common single final lens, the reticle area covered per unit of time is simply defined by the length of the sweep. An increased printing speed may therefore be achieved by increasing the length of the sweep or increasing the number of parallel beams in the common single final lens. Today, up to 15 parallel beams are used in the common single final lens, and this quantity may increase further. However, even an increase by 15 additional parallel beams, which is not entirely technically trivial, will only increase the total printing speed by a factor of 2. Further increases of printing speed is requested.

An attempt to improve on the printing speed was undertaken some years ago by increasing the sweep length. A new tellurium oxide deflector offering a double sweep length was developed. New optics used in the writing head and being capable of supporting the new sweep length was designed and sourced. Unfortunately, it has been found out that the masks printed with the full sweep length offered by this deflector exhibit visible defects called mura. This mura is attributed to the overlap zones which are spaced by the length of the sweep. If this separation is too large, the small imperfections of the overlap zones seem to be detectable by a human eye. The sole increase of the sweep length does not seem to be a path forward as far as the printing speed is concerned.

Also in other writers, not having the mura requirement, any increase of the printing speed is desirable as it would simply increase profitability of the writer.

In the published international patent application WO 2020/120725 A1, a method of reducing the impact of cross-talk between transducers that drive an acousto-optic modulator in a single-head, multi-beam writer is disclosed. The method includes operating the transducers, which are mechanically coupled to an acousto-optic modulator medium, with different frequencies applied to adjoining transducers and producing a time-varying phase relationship between carriers on spatially adjoining modulation channels emanating from the adjoining transducers, with a frequency separation between carriers on the adjoining channels of 400 KHz to 20 MHz.

In the published US patent application US 2020/0166852 A1, a lithography apparatus for writing to substrate wafers is disclosed. The apparatus includes a light generating device including a plurality of light sources for generating light, a writing device, a light transferring device including a number of optical waveguides for transferring the light from the light generating device to a writing device. The writing device includes a plurality of individually controllable write heads for projecting the light from the one or the plurality of light sources in different regions of a substrate wafer. The apparatus also includes a transport device for moving the substrate wafer relative to the writing device in a predefined transport direction, and a control device for controlling the writing process on the substrate wafer. The modulation is performed by electrooptical modulators and the light comes from a plurality of light sources, which removes any use of a beam-splitter.

In the published US patent application US 2009/0273793 A1, a drawing position measuring method and apparatus, and a drawing method and apparatus are disclosed. At least three slits are provided in the same plane as the drawing plane. Light that has been modulated by the drawing point formation means and has passed through the at least three slits is detected. Two position information items about the drawing point are obtained based on respective relative movement position information items about the drawing plane corresponding to the points of time of detecting the light that has passed through the at least three slits. The position of the drawing point is measured based on the at least two position information items.

SUMMARY

A general object of the present technology is therefore to find ways to increase the printing speed without giving rise to mura effect.

The above object is achieved by methods and devices according to the independent claims. Preferred embodiments are defined in dependent claims.

In general words, in a first aspect, a scanning lithographic laser writer, comprises a substrate holder, an irradiation arrangement and a control unit. The substrate holder has attachment means for holding a substrate with a laser-light sensitive surface in a substrate plane. The irradiation arrangement has a laser source, a multi head modulator arrangement and m writing head arrangements, where m≥2.

The irradiation arrangement is arranged for providing laser light from the laser source, via the multi head modulator arrangement to the m writing head arrangements to irradiate the substrate plane. The control unit is configured for controlling a relative mechanical displacement between the substrate holder and the m writing head arrangements in at least a scan direction parallel to the substrate plane. The control unit is configured for controlling a sweep of laser light exiting from the m writing head arrangements in a sweep direction parallel to the substrate plane and transverse to the scan direction. The multi head modulator arrangement is configured to split and modulate an input beam originating from the laser source into n modulated beams, where $n \geq 1$, for each of the m writing head arrangements by use of an acoustic-optical crystal. The m heads are positioned such that laser light exiting from each of the m writing head arrangements becomes displaced with a predetermined non-zero distance in the sweep direction with respect to each other.

In a second aspect, a method for operating a scanning lithographic laser writer comprises providing of a laser input beam. The laser input beam is split and, by acoustic-optical modulation, modulated into n modulated beams, where $n \geq 1$, for each of m writing head arrangements, where $m \geq 2$. The n modulated beams for the m writing head arrangements are optically connected to the respective writing head arrangements. A substrate plane of the scanning lithographic laser writer is irradiated by the n modulated beams for the m writing head arrangements. The substrate plane and the m writing head arrangements are displaced relative to each other in at least a scan direction parallel to the substrate plane. The n modulated beams exiting from the m writing head arrangements are swept in a sweep direction parallel to the substrate plane and transverse to the scan direction. The n modulated beams exiting from each of the m writing head arrangements at all instances are displaced with a predetermined non-zero distance in the sweep direction with respect to each other.

One advantage with the proposed technology is that the printing speed is increased proportionally to the amount of the printing heads while most parts of existing equipment can be used without extensive changes. Other advantages will be appreciated when reading the detailed description.

BRIEF DESCRIPTION OF THE DRAWINGS

The invention, together with further objects and advantages thereof, may best be understood by making reference to the following description taken together with the accompanying drawings, in which:

FIG. 2 illustrates schematically the conditions during writing for a single-head modulation, multiple beam arrangement;

FIG. 5 illustrates schematically the conditions during writing for a multi head modulation, multiple beam arrangement;

DETAILED DESCRIPTION

Throughout the drawings, the same reference numbers are used for similar or corresponding elements.

Figure 1:
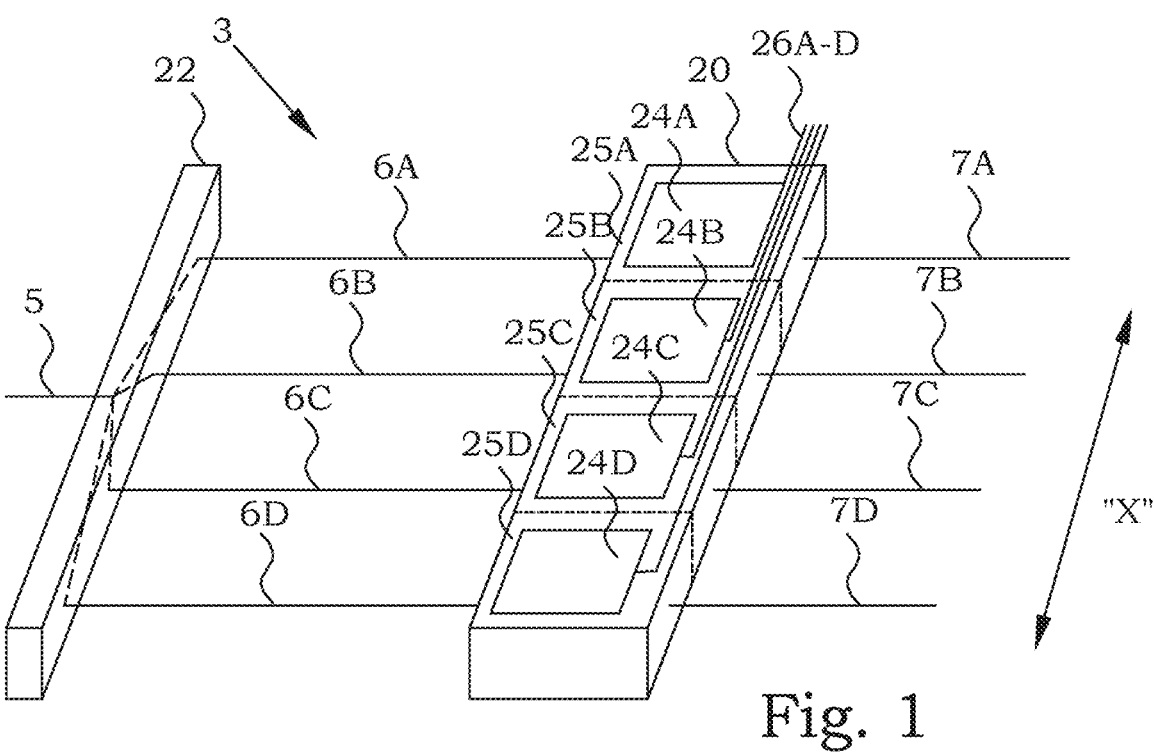
FIG. 1 is a schematic illustration of a single-head modulation arrangement.

For a better understanding of the proposed technology, it may be useful to begin with a brief overview of a segmented multichannel acoustic-optical modulator. In FIG. 1, a single-head modulation arrangement 3 with four writing beams is schematically illustrated. An input laser beam 5 is split in a beam splitter 22 into, in this example, four split input beams 6A-D. Each split input beam 6A-D is connected to a respective modulator segment 25A-D of an acoustic-optical modulator 20. Electrical connections 26 are provided for enabling provision of radio frequency signals to transducers 24A-D, one for each modulator segment 25A-D. Each modulator segment 25A-D of the acoustic-optical modulator 20 modulates individually the split input beams 6A-D into modulated beams 7A-D. The modulated beams 7A-D are then provided to a single writing head, where the modulated beams 7A-D are allowed to reach the surface on which the writing is to be performed spread out in the X direction. Each modulated beam 7A-D is also swept in the Y direction, synchronously and parallel to each other.

Depending on the actual design, the number of split input beams can be changed. However, there is typically a maximum limit set by different design features. This means that the "X" direction of the acousto-optical modulator 20 cannot be further utilized.

FIG. 2 illustrates schematically the conditions during writing. A writing head 50 is scanned in a scan direction 90, also denoted as the X direction. A number of beams, in this particular embodiment four beams, are separated in the X direction by a distance m and are swept in a sweep direction 91, also denoted as the Y direction. This sweeping give rise to an illumination of four stripes 92 of a laser-light sensitive surface 64 in a substrate plane supported by a substrate holder 60 at a time. The writing head 50 is scanned a distance d in the X direction relative the substrate holder 60 and a new exposure of the laser-light sensitive surface 64 is made. When the entire writing head 50 has passed a portion at the laser-light sensitive surface 64, stripes 93 cover the entire portion.

In alternative approaches, the relative scan of the writing head 50 may be a continuous process, whereby the sweep direction of the stripes 92, 93 are not exactly perpendicular to the scan direction, but still transverse to the scan direction. However, the basic function is analogue to the above pre-sented approach.

According to the present technology, the cross-dimension of the acousto-optical modulator 20 may instead be used to achieve additional modulated beams that may be used.

Figure 3:
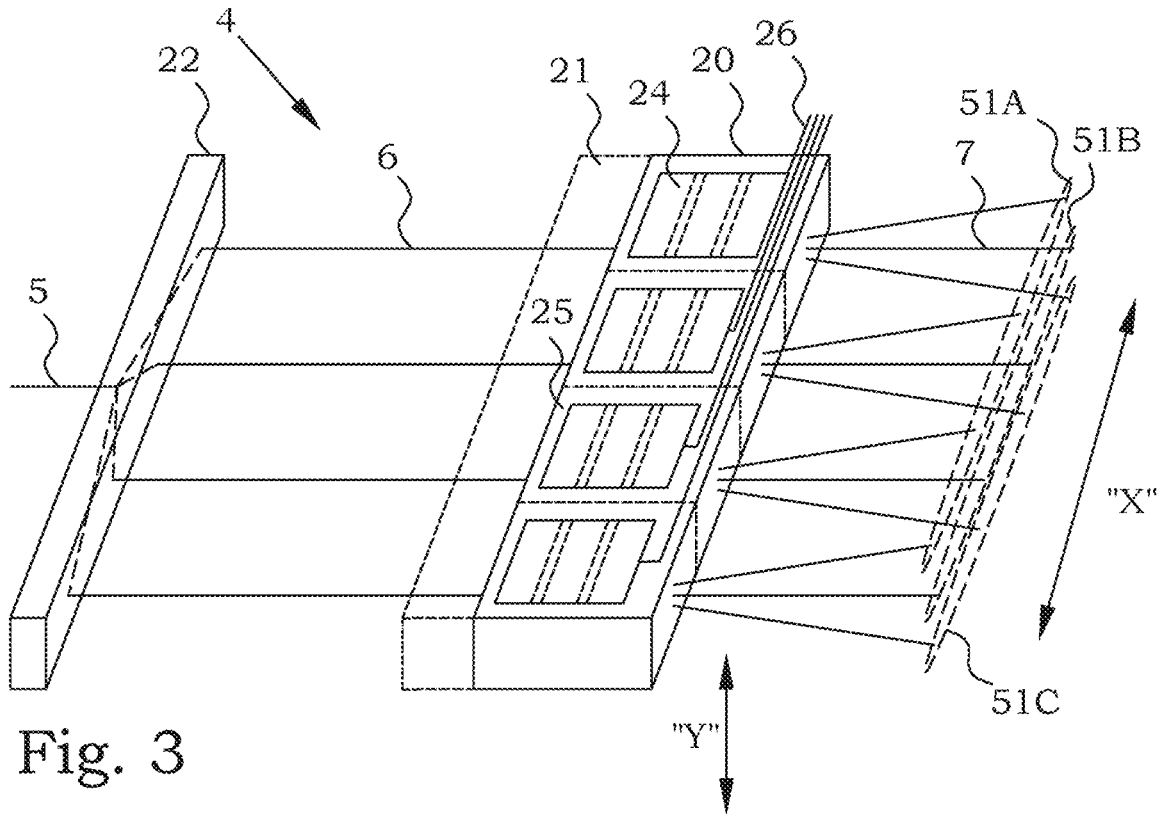
FIG. 3 is a schematic illustration of a multi head modulation arrangement.

FIG. 3 is a schematic illustration of an embodiment of a multi head modulation arrangement 4. Most parts are similar to those presented in FIG. 1, however, the reference numbers are reduced and the distinguishing letters A-D are omitted in most cases. The acousto-optical modulator 20 is in this particular embodiment operated in order to output three different modulated beams 7 from each modulator segment 25. As will be discussed further below, this may be achieved by supplying multi-frequency signals to the transducer 24 or as indicated by the dotted lines by supplying different single-frequency signals to multiple transducers in each modulator segment 25. As also indicated by the dotted lines, an additional beam-splitter arrangement 21 may be provided in front of the acousto-optical modulator 20.

The outgoing modulated beams 7 are divided in groups 51A, 51B and 51C depending on the outgoing angle. Each group 51A, 51B and 51C is provided to a respective writing head, where the beams within each group are spread out in the X direction, in analogy with the example in FIG. 1, but where the different groups also have a separation in the Y direction. This will be further discussed below. All modu-lated beams are individually modulated and contribute to the total writing speed. The "Y" direction of the acousto-optical modulator 20 is thereby utilized to provide modulated beams to multiple writing heads.

In the Figures above, four modulator segments are illus-trated. However, anyone skilled in the art understands that any number of modulator segments, from 1 and up, may be utilized, as long as the remaining equipment is capable of handling that number of parallel beams for each writing head.

Figure 4:
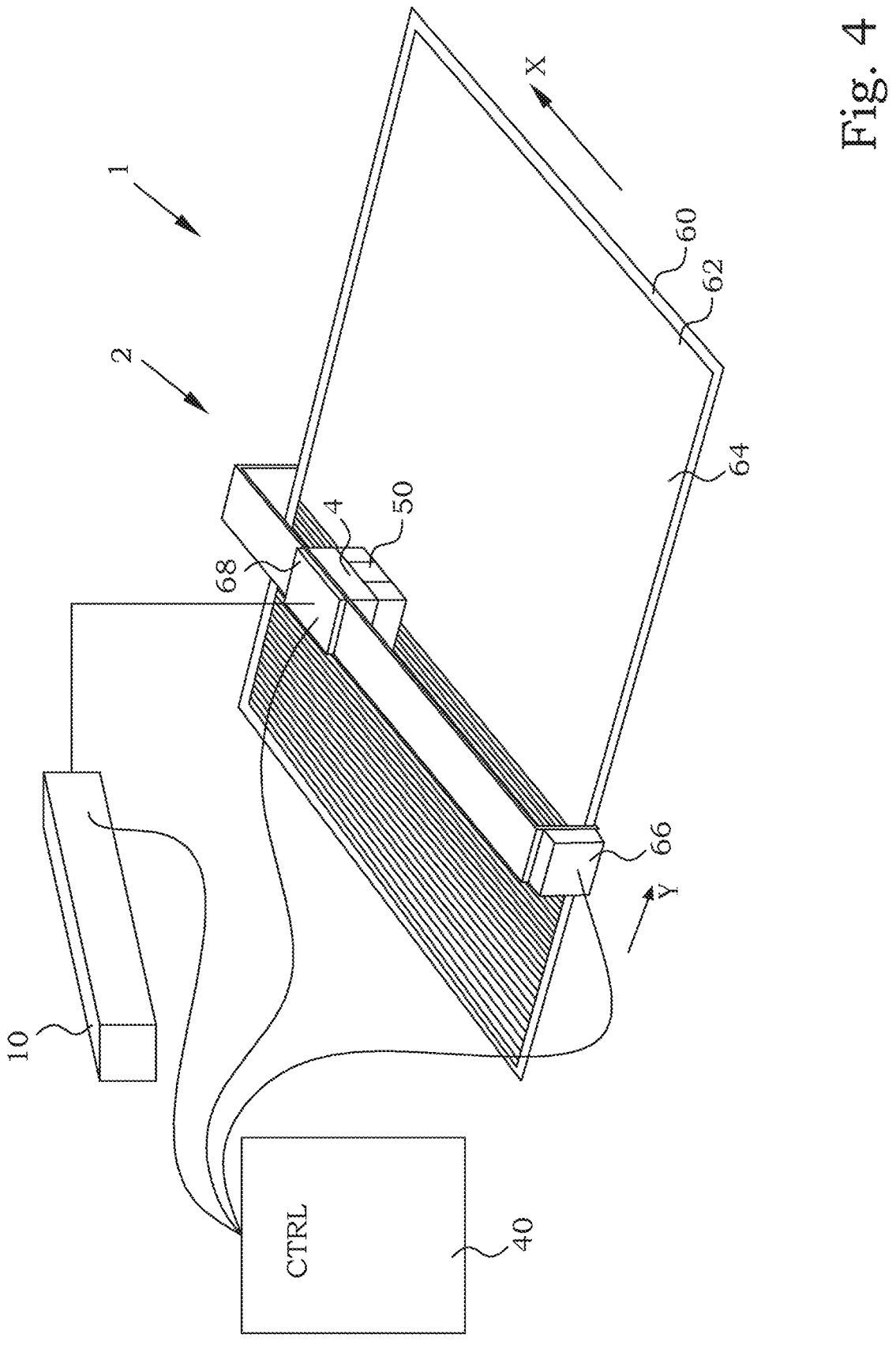
FIG. 4 schematically illustrates an embodiment of a scanning lithographic laser writer.

FIG. 4 schematically illustrates an embodiment of a scanning lithographic laser writer 1. The scanning litho-graphic laser writer 1 comprises a substrate holder 60 having attachment means for holding a substrate 62 with a laser-light sensitive surface 64 in a substrate plane. The scanning lithographic laser writer 1 further comprises an irradiation arrangement 2. The irradiation arrangement 2 has a laser source 10, a multi head modulator arrangement 4 and at least two writing head arrangements 50. The irradiation arrange-ment 2 is arranged for providing laser light from the laser source 10, via the multi head modulator arrangement 4 to the writing head arrangements to irradiate the substrate plane. The scanning lithographic laser writer 1 also comprises a control unit 40. The control unit 40 is configured for controlling a relative mechanical displacement between the substrate holder 60 and the writing head arrangements 50 in at least one scan direction X parallel to the substrate plane. Typically, the control unit 40 is configured for controlling a relative mechanical displacement between the substrate holder 60 and the writing head arrangements 50 also in a direction perpendicular to the scan direction in order to allow multiple scans. The control unit 40 is also configured for controlling a sweep of laser light exiting from the writing head arrangements in a sweep direction Y parallel to the substrate plane and transverse to the scan direction X. The multi head modulator arrangement 4 is configured to split and modulate an input beam originating from the laser source 10 into at least one modulated beam, and preferably a multitude of modulated beams, for each of the writing head arrangements by use of an acoustic-optical crystal. This will be further described below. The control unit 40 is typically also responsible for other requested tasks such as an active focus control, e.g. control of the lens to mask distance. Such control is, as such, well-know by any person skilled in the art and is therefore not further described. The plurality of writing head arrangements is positioned such that laser light exiting from each of the writing head arrangements becomes displaced with a predetermined non-zero distance in the sweep direction Y with respect to each other.

In the embodiment of the illustration above, the multi head modulator arrangement 4 is illustrated as being moved together with the writing head arrangements 50. However, in alternative embodiments, the multi head modulator arrange-ment 4 may be positioned between the laser source 10 and the writing head arrangements 50, but being arranged for not being moved during the X stroke.

FIG. 5 schematically illustrates the situation at the sub-strate plane for one embodiment. Three writing head arrangements 50A, 50B and 50C are displaced in the Y direction with respect to each other. Each writing head arrangement 50A-C gives rise to an illumination scan, which increases the available writing speed. In this embodiment, there is no overlap in the Y direction of the scans of the different writing head arrangements 50A-C. However, as will be discussed further below, in other embodiments overlaps and/or multiple exposures in the Y direction of the scans of the different writing head arrangements 50A-C may be present.

Figure 6:
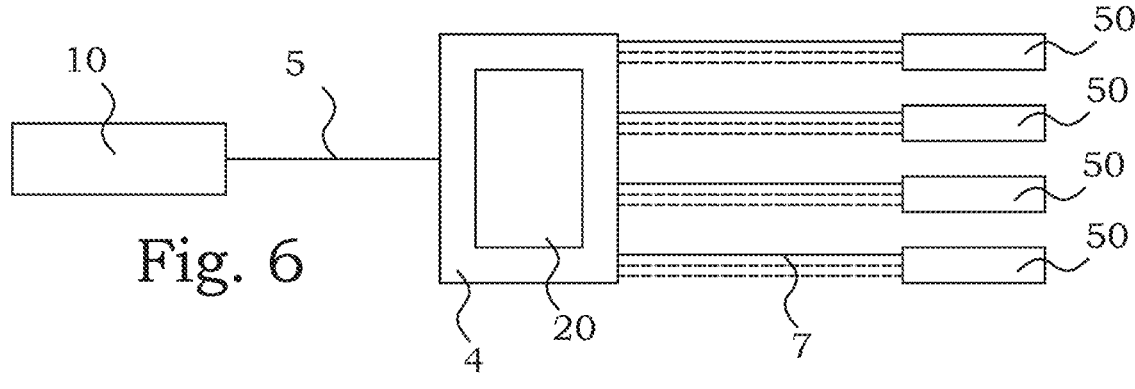
FIG. 6 schematically illustrates an embodiment of an irradiation arrangement.

FIG. 6 schematically illustrates an embodiment of an irradiation arrangement 2. An input laser beam 5 is provided from a laser source 10 to a multi head modulation arrange-ment 4, comprising an acousto-optical modulator 20. The multi head modulation arrangement 4 splits and modulates the light into modulated beams 7, which are provided to a multitude of writing head arrangements 50. Each writing head arrangement 50 may be configured for handling one or a plurality of modulated beams 7, as indicated by the dotted lines.

Figure 7:
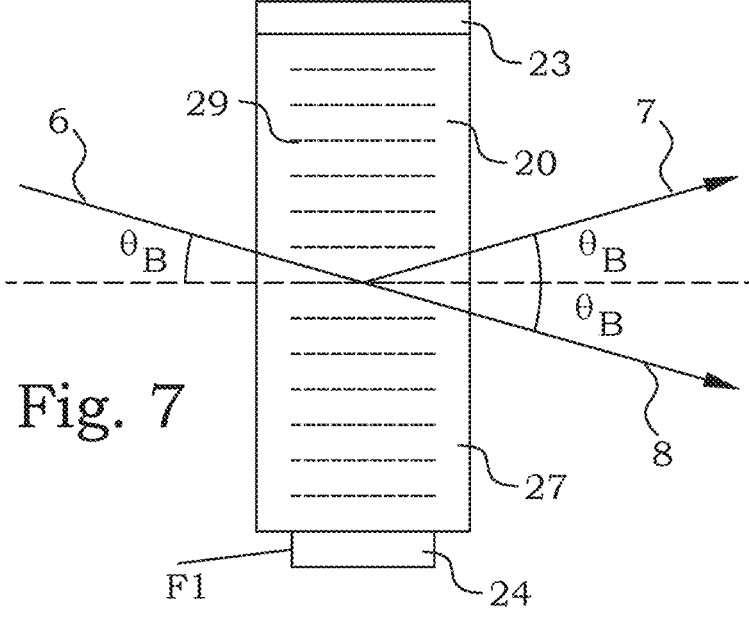
FIG. 7 illustrates an embodiment of an acousto-optical modulator.

FIG. 7 illustrates an embodiment of an acousto-optical modulator 20. For simplicity, only one modulator segment is shown, however, the person skilled in the art realizes that parallel modulator segments may be present. The function of an acousto-optic modulator (AOM) is known, as such, in prior art, and will not be described in every detail. In general terms, a transducer 24 is caused to vibrate at a radio frequency, creating sound waves in the crystal 27. A com-monly used crystal material is e.g. quartz. The sound waves are finally absorbed by an acoustic absorber 23 in order to avoid any resonance behaviors. When incoming light expe-riences the sound waves, an interaction between the phonons of the sound waves and the photons of the light results in scattering and interference, causing a deflected beam.

The highest efficiency of the deflected beam is typically achieved under Bragg conditions, when the light impinges at Bragg angle $\theta_B$, defined as:

$$\sin \theta_B = \lambda/2n\Lambda, \tag{1}$$

with respect to the perpendicular direction to the sound wave propagation, and where $\lambda$ is the light wavelength in vacuum, n is the refractive index and $\Lambda$ is the sound wavelength. The highest diffracted intensity then occurs at an outgoing angle corresponding to the Bragg angle.

In FIG. 7, this is illustrated by the (split) input beam 6 impinging onto the AOM crystal 27, in which sound waves 29 are generated by exciting the transducer 24. A transmitted beam 8 is illustrated together with a modulated beam 7. The modulated beam 7 is leaving the AOM crystal 27 with the Bragg angle $\theta_B$. The amount of light diffracted by the sound waves depends on the intensity of the sound. Therefore, by changing the vibration excitation of the transducer, the intensity of the outgoing light can be modulated, giving a modulated beam 7.

Even if the most efficient diffraction takes place at an incident light angle equal to the Bragg angle, diffraction does also occur at other incident angles. This can be used for obtaining multiple diffracted beams.

Figure 8:
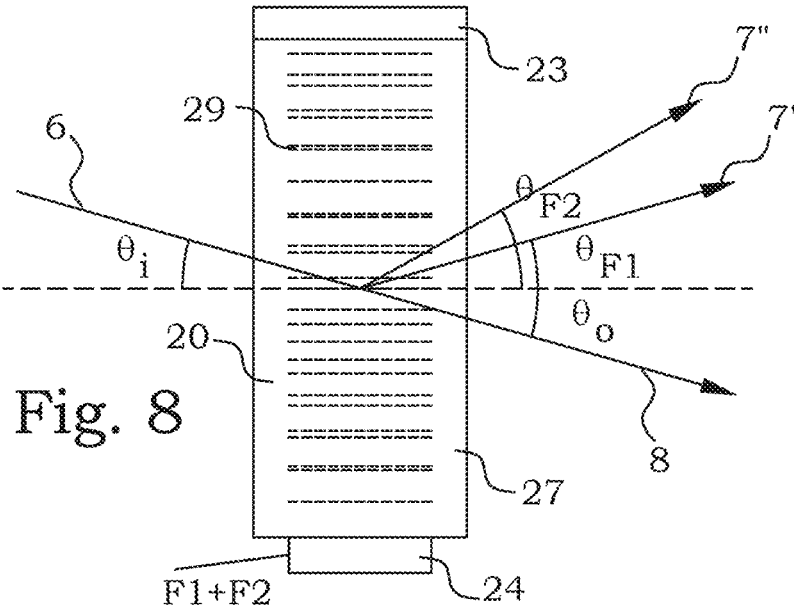
FIG. 8 illustrates an embodiment of an acousto-optical modulator operating with more than one frequency and a common transducer.

In FIG. 8, an embodiment of an acousto-optical modulator 20 is illustrated. An input beam 6 impinges with an incoming angle $\theta_i$. The transducer 24 is supplied with a signal being a sum of two single radio frequency signals F1 and F2. These radio frequency signals give rise to sound waves 29 with corresponding frequencies in the crystal 27. A non-diffracted beam 8 leaves the crystal 27 in an outgoing angle $\theta_o$ equal to the incoming angle $\theta_i$. The sound waves 29 of frequency F1 give rise to a first diffracted modulated beam 7' in a first diffracted angle $\theta_{F1}$. Similarly, the sound waves 29 of frequency F2 give rise to a second diffracted modulated beam 7" in a second diffracted angle $\theta_{F2}$. Depending on the crystal bandwidth properties, the first diffracted angle $\theta_{F1}$ and the second diffracted angle $\theta_{F2}$ may have enough intensity and still be separated by a non-negligible angle. It is thus possible to separate the modulated beams and use them in different writing heads. Preferably, the Bragg angle $\theta_B$ is situated between the first diffracted angle $\theta_{F1}$ and the second diffracted angle $\theta_{F2}$ or is equal to one of them.

This embodiment would require the RF bandwidth of the acousto-optical modulator 20 to be sufficiently large to support the abovementioned beam separation requirement. For quartz acousto-optical modulator 20 and 405 nm wavelength it would require a bandwidth of around 60 MHz.

Figure 9A:
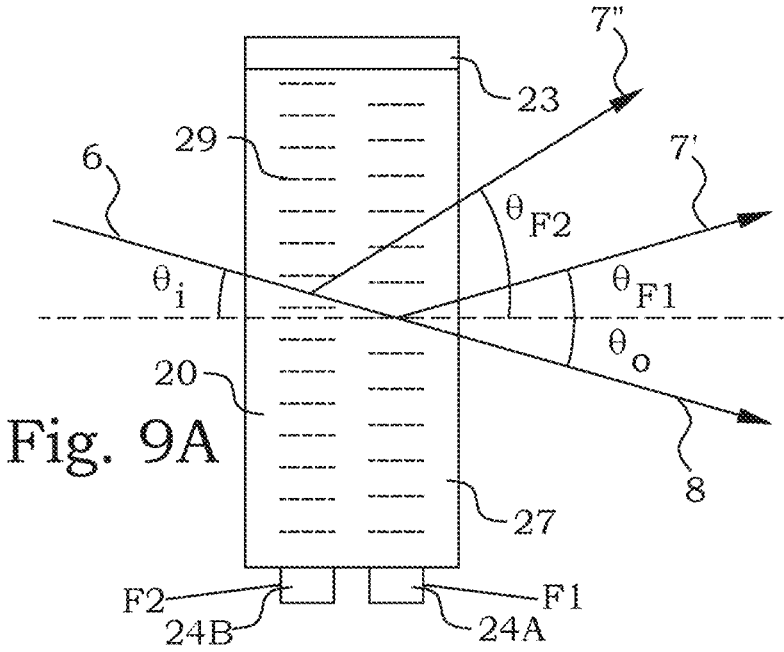
FIG. 9A illustrates an embodiment of an acousto-optical modulator operating with more than one frequency and separated transducers.

In FIG. 9A, another embodiment of an acousto-optical modulator 20 is illustrated. Here, the acousto-optical modulator 20 is equipped with two transducers 24A and 24B, physically separated in the direction of the impinging input light 6. A single radio-frequency signal of frequency F1 is provided to the first transducer 24A and a single radio-frequency signal of frequency F2 is provided to the first transducer 24B. The transducers 24A and 24B thereby give rise to two sound waves 29 in the crystal 27 with frequencies F1 and F2. Thereby, the input beam 6 first interacts with the sound wave 29 of frequency F2 and a second diffracted modulated beam 7" in a second diffracted angle $\theta_{F2}$ is achieved. Thereafter, the input beam 6 interacts with the sound wave 29 of frequency F1 and a first diffracted modulated beam 7' in a first diffracted angle $\theta_{F2}$ is achieved.

In other words, FIG. 9A illustrates a phase array transducer embodiment. For quartz, the commercially available phase arrays support the bandwidth of 250 MHz. However, no multifrequency and multichannel acousto-optical modulator devices equipped with a phase array is available on the market. This embodiment offers an alternative implementation, where the separate transducers are driven by different frequencies. This simplifies the requirements on the RF delivery electronics, since the RF waves are pure sinusoidal waves and not the sum of those, but limits the amount of diffracted beams to the size of the phase array.

Figure 9B:
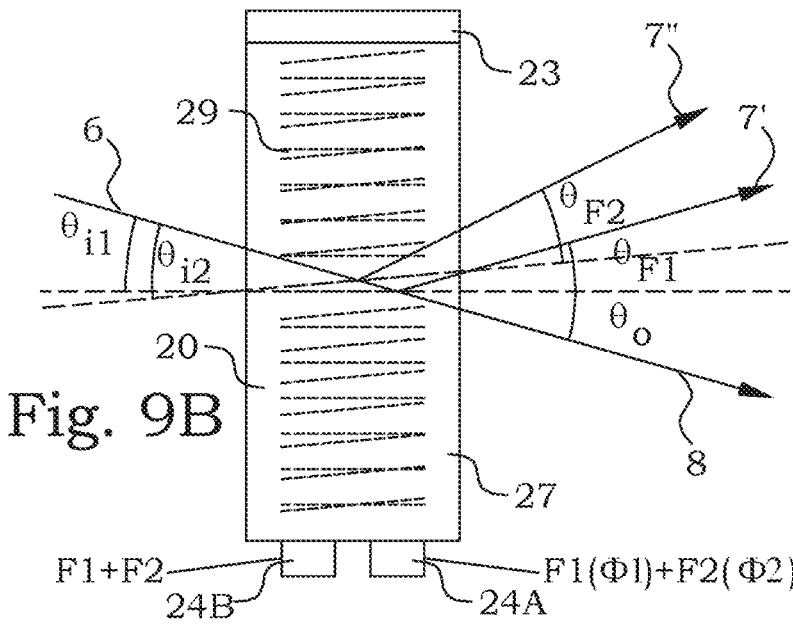
FIG. 9B illustrates an embodiment of another acousto-optical modulator operating with more than one frequency and separated transducers.

In FIG. 9B, yet another embodiment of an acousto-optical modulator 20 is illustrated. Here, the acousto-optical modulator 20 is also equipped with two transducers 24A and 24B, physically separated in the direction of the impinging input light 6. The transducers 24A and 24B are supplied with a signal being a sum of two single radio frequency signals F1 and F2. However, the signal provided to transducer 24A has a different phase relation between the two single radio frequency signals F1 and F2 compared to the signal that is provided to the transducer 24B. These radio frequency signals give rise to two sound waves 29 with corresponding frequencies in the crystal 27.

Due to the phase differences, the directions of the respective sound waves are different. The input beam 6 therefore has a first incoming angle $\theta_{i1}$ with respect to the first sound waves, and a second incoming angle $\theta_{i1}$ with respect to the second sound waves. The input beam 6 interacts with the sound wave 29 of frequency F1 and a first diffracted modulated beam 7' in a first diffracted angle $\theta_{F1}$ is achieved. The input beam 6 also interacts with the sound wave 29 of frequency F2 and a second diffracted modulated beam 7" in a second diffracted angle $\theta_{F2}$ is achieved.

In the embodiments illustrated above, two diffracted modulated beams are produced by use of two different transducer frequencies. However, these principles can be generalized into the use of more than two different radio frequencies, giving more than two diffracted modulated beams. The maximum number of diffracted modulated beams is determined by the bandwidth properties of the crystal and geometrical consideration.

In other words, in particular embodiments, the input beam for each modulator segment of the acousto-optical modulator is provided as a single incident beam to the acousto-optical crystal. A radio-frequency bandwidth of the acousto-optical crystal enables diffracted beams associated with the plurality of head-assigned frequencies. Preferably, the single incident beam is provided to the acousto-optical crystal with an incident angle within the interval between a Bragg angle associated with a highest one of the head-assigned frequencies and a Bragg angle associated with a lowest one of the head-assigned frequencies.

If sound waves with different directions are provided, the single incident beam may be provided in a Bragg angle with respect to both sound waves, by adapting the phase differences between the frequencies F1 and F2.

A remaining problem with this design is that the diffraction efficiency of the first diffracted modulated beam 7' and the first diffracted modulated beam 7" both depend, at least to a part, on the powers of both radio frequency signals. This means that a change in the power of one of the frequencies will influence the diffraction efficiency, not only of the diffracted modulated beam being associated with this frequency, but also of the other diffracted modulated beam. There is thus a crosstalk between the modulations of the two modulated beams. In order to achieve a high-accuracy modulation, such crosstalk has to be pre-compensated, which typically is a very difficult task. Given a current speed of data clocking of 50-65 MHz, synchronization and rise time of the electrical RF signals of one or a few nanoseconds might be needed Another alternative is to use the dominant diffraction at Bragg conditions. If diffraction at or very close to an associated Bragg angle $\theta_{B1}$ is used for one frequency, another frequency associated with another Bragg angle $\theta_{B2}$ will result in a very small diffraction. This will eliminate or at least significantly reduce any crosstalk. However, instead, control of the input angle has to be provided.

Figure 10:
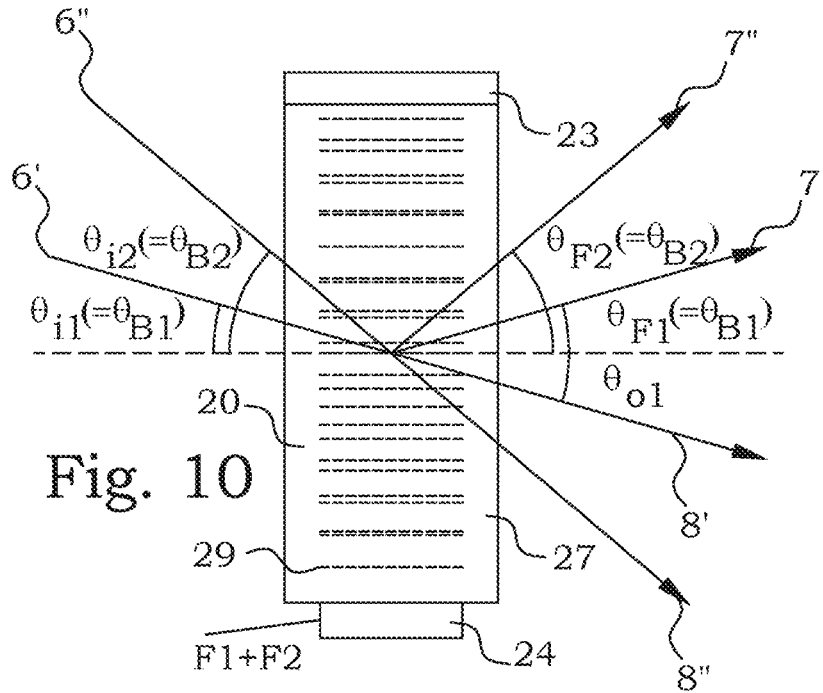
FIG. 10 illustrates an embodiment of an acousto-optical modulator operating with more than one incident beam, more than one frequency and a common transducer.

In FIG. 10, another embodiment of an acousto-optical modulator 20 is illustrated. Here, the acousto-optical modulator 20 is provided with two input beams 6', 6", having a respective incoming angle $\theta_{i1}$, $\theta_{i2}$. These incoming angles are preferably Bragg angles $\theta_{B1}$, $\theta_{B2}$ associated with the frequencies F1 and F2 supplied to the transducer 24. Each input beam 6', 6" gives rise to a respective diffracted beam 7', 7". If the incoming angle of a first one of the beams is close to the associated Bragg angle, the diffraction of the other input beam becomes essentially negligible, and vice versa. In such a way, any modulation of the diffracted beam 7' does not significantly influence the modulation of the diffracted beam 7" and any modulation of the diffracted beam 7" does not significantly influence the modulation of the diffracted beam 7'. Hence, any crosstalk is essentially removed.

Figure 11A:
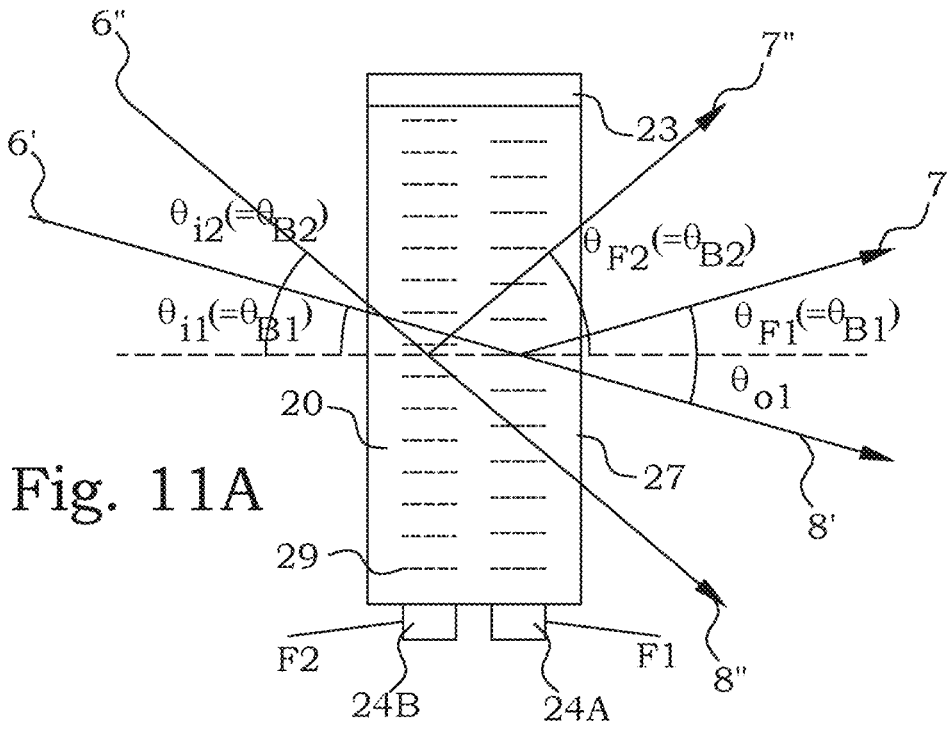
FIG. 11A illustrates an embodiment of an acousto-optical modulator operating with more than one incident beam, more than one frequency and separated transducers.

FIG. 11A schematically illustrates another embodiment of an acousto-optical modulator 20 with more than one input beam, but with separate transducers 24A, 24 B for the different frequencies F1 and F2.

Figure 11B:
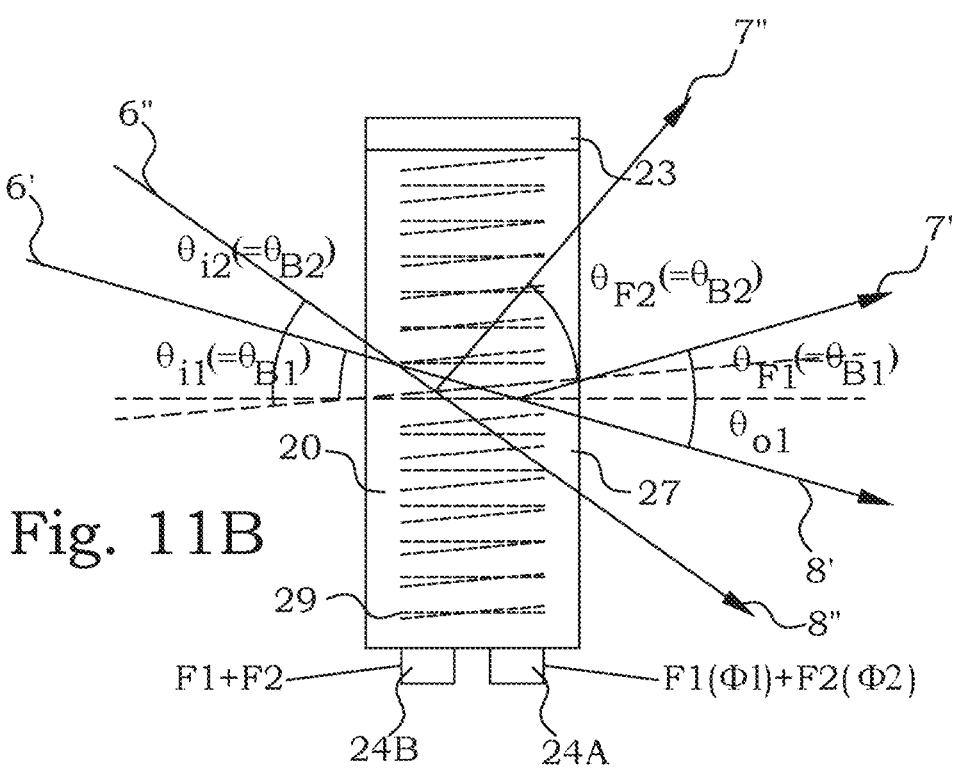
FIG. 11B illustrates another embodiment of an acousto-optical modulator operating with more than one incident beam, more than one frequency and separated transducers.

FIG. 11B schematically illustrates another embodiment of an acousto-optical modulator 20 with more than one input beam and with separate transducers 24A, 24 B. As in FIG. 9B, the transducers 24A and 24B are supplied with a signal being a sum of two single radio frequency signals F1 and F2. The signal provided to transducer 24A has a different phase relation between the two single radio frequency signals F1 and F2 compared to the signal that is provided to the transducer 24B, thereby giving rise to a direction difference between the provided sound waves 29.

If sound waves with different directions are provided, the single incident beam may be provided in a Bragg angle with respect to both sound waves, by adapting the phase differences between the frequencies F1 and F2.

These embodiments of FIGS. 10 and 11A-B require multiple incident light beams. Each of the incident beams will be diffracted by a different RF frequency provided by either one transducer or a transducer phase array. As the Bragg conditions for a given incident beam will be satisfied by a single RF frequency only, the crosstalk is avoided. The RF frequency will not affect the intensity of the beam unless the phase matching occurs.

The principles in FIGS. 8-11B for performing two modulations simultaneously in a single acousto-optical modulator can of course be applied for achieving more than two simultaneous modulations, by using more than two excitation frequencies.

In other words, in one embodiment, the multi head modulator arrangement comprises an acousto-optical modulator having at least one modulator segment. The or each segment is configured to split and modulate an input beam originating from the laser source into one modulated beam for each of a multitude of writing head arrangements.

If the writing head arrangements operate with a plurality of parallel beams each, such a division is made before the acousto-optical modulator, as can be seen in e.g. FIG. 3. The acousto-optical modulator thereby comprises a plurality of modulator segments, each one configured for splitting and modulating an input beam originating from the laser source into one modulated beam for each of a multitude of writing head arrangements.

In other words, in one embodiment, where the acousto-optical modulator comprises a plurality of modulator segments, the multi head modulator arrangement comprises a first beam-splitter arrangement, splitting the beam from the laser source into a plurality of input beams, and wherein each of the plurality of input beams is provided to a respective one of the modulator segments.

In FIGS. 9A and 11A, the acousto-optical modulator comprises two transducers, excited by single-frequency signals, associated with a respective one of the writing heads. This concept may of course also be used for more than two transducers. In other words, in one embodiment, each modulator segment of the acousto-optical modulator comprises a plurality of transducers. Each of the plurality of transducers is driven by a respective head-assigned frequency, different from the head-assigned frequencies of the other transducers.

In FIGS. 9B and 11B, each of the transducers 24A, 24B is driven by a radio-frequency signal that is a sum F1+F2 of radio-frequency signals, each having a respective different frequency F1, F2, where frequency shifts is different from the head-assigned frequencies F1, F) of the other transducer 24A, 24B. This can of course be generalized to more than two frequencies and more than two transducers.

In FIGS. 8 and 10, the acousto-optical modulator comprises a single transducer, excited by a radio-frequency signal that is a sum of two single-frequency signals. These single-frequency signals are associated with a respective one of the writing heads. This concept may of course also be used for more than two transducers. In other words, in one embodiment, each modulator segment of the acousto-optical modulator comprises one common transducer. The transducer is driven by a radio-frequency signal being a sum of a plurality of radio-frequency signals, each having a respective different head-assigned frequency.

In the embodiments based on a plurality of incident beams to the acousto-optical modulator, the incident beams have to be provided in different incident angles. Preferably, the different incident angles correspond to respective Bragg angles associated with the head-assigned frequencies.

Figure 12:
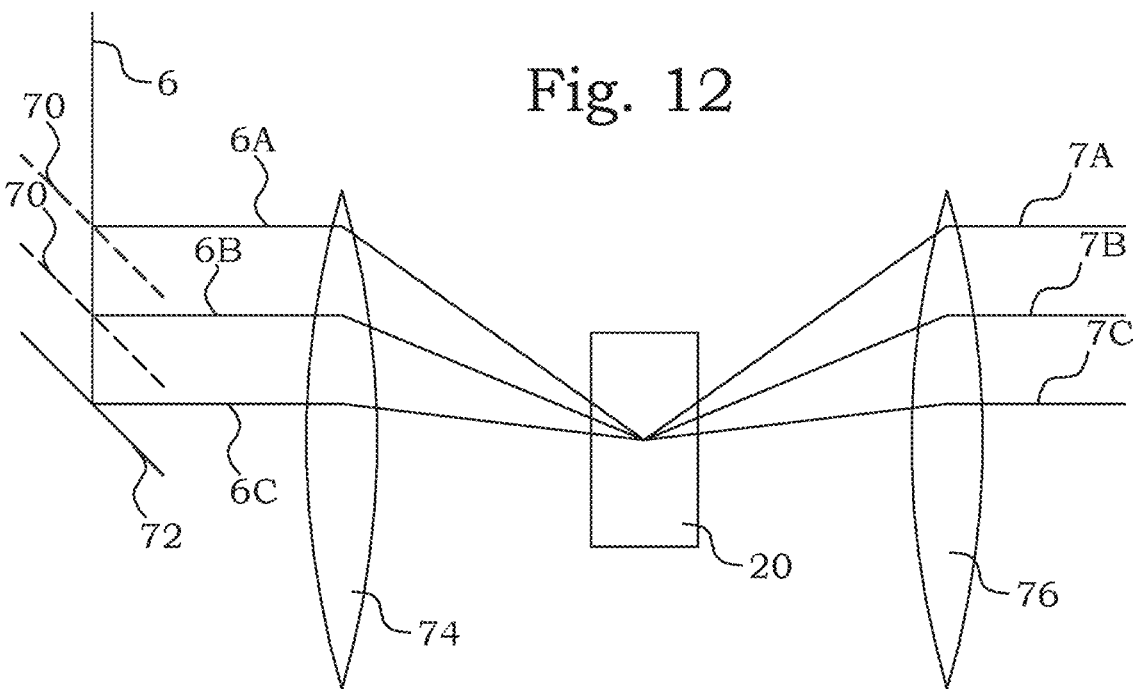
FIG. 12 illustrates schematically an embodiment of an arrangement providing beams with different incident angles.

One arrangement for achieving this is schematically illustrated in FIG. 12. An input beam 6 is directed to two consecutive beam splitter devices 70 and a final mirror 72, dividing the input beam 6 into three parallel split input beams 6A-6C. A lens arrangement 74 serves for focusing the different split input beams 6A-6C to a common focus point in the acousto-optical modulator 20. The acousto-optical modulator 20 is driven by three different radio frequencies, preferably adapted to give Bragg angles equal to the angles in which the split input beams 6A-6C are reaching the acousto-optical modulator 20. Diffracted modulated beams 7A-7C are thereby provided in three different outgoing angles, and these divergent beams are caused to form parallel modulated beams by a second lens arrangement 76. In this particular embodiment, three modulated beams 7A-7C were provided, but anyone skilled in the art realizes that any number of modulated beams 7A-7C can be achieved in this.

The above principle of providing separate beams incident onto the acousto-optical modulator 20 in different angles is just one illustrative example. Any person skilled in the art realizes that many other optical arrangements are available in prior art resulting in the same beam geometries.

In other words, in one embodiment, the multi head modulator arrangement comprises a plurality of second beam-splitter arrangements, one for each modulator segment of the acousto-optical modulator, configured for splitting the input beam into a plurality of incident beams provided to the acousto-optical crystal in different incident angles.

Above, four particular embodiments are presented. All of them utilize a novel multi-channel, multi-frequency acousto optical modulator. The main difference to the currently used acousto optical modulators is that out of each single segment of the acousto optical modulator there are multiple beams emerging in the writer Y direction. In current designs a single beam is diffracted by a single acousto optical modulator channel only. These multiple beams are both intensity-modulated and angled by a sufficiently large angle so that each individual acousto optical modulator channel can support pattern printing through different optical heads.

As mentioned above, the modulation of the acousto-optical modulator is controlled by the intensities of the different frequency components provided to the transducer or transducers of the acousto-optical modulator. With reference to FIG. 4, in a preferred embodiment, the control unit 40 is utilized for providing appropriate signals to the transducers of the acousto-optical modulator of the multi head modulation arrangement 4. The intensities of each individual modulated beam exiting the acousto-optical modulator may thereby be adapted to a predetermined print pattern. This adapting also has to be synchronized with the sweep of the laser lights performed by the writing heads as well as with the relative movements between the substrate and the writing heads.

In other words, in one embodiment, the control unit is configured for modifying signals of the head-assigned frequencies of each modulator segment of the acousto-optical modulator for adapting an intensity of beams exiting the acoustic-optical crystal according to a predetermined print pattern in dependence of the sweep of the laser light exiting from the plurality of writing head arrangements and the relative mechanical displacement between the substrate holder and the plurality of writing head arrangements.

Figure 13:
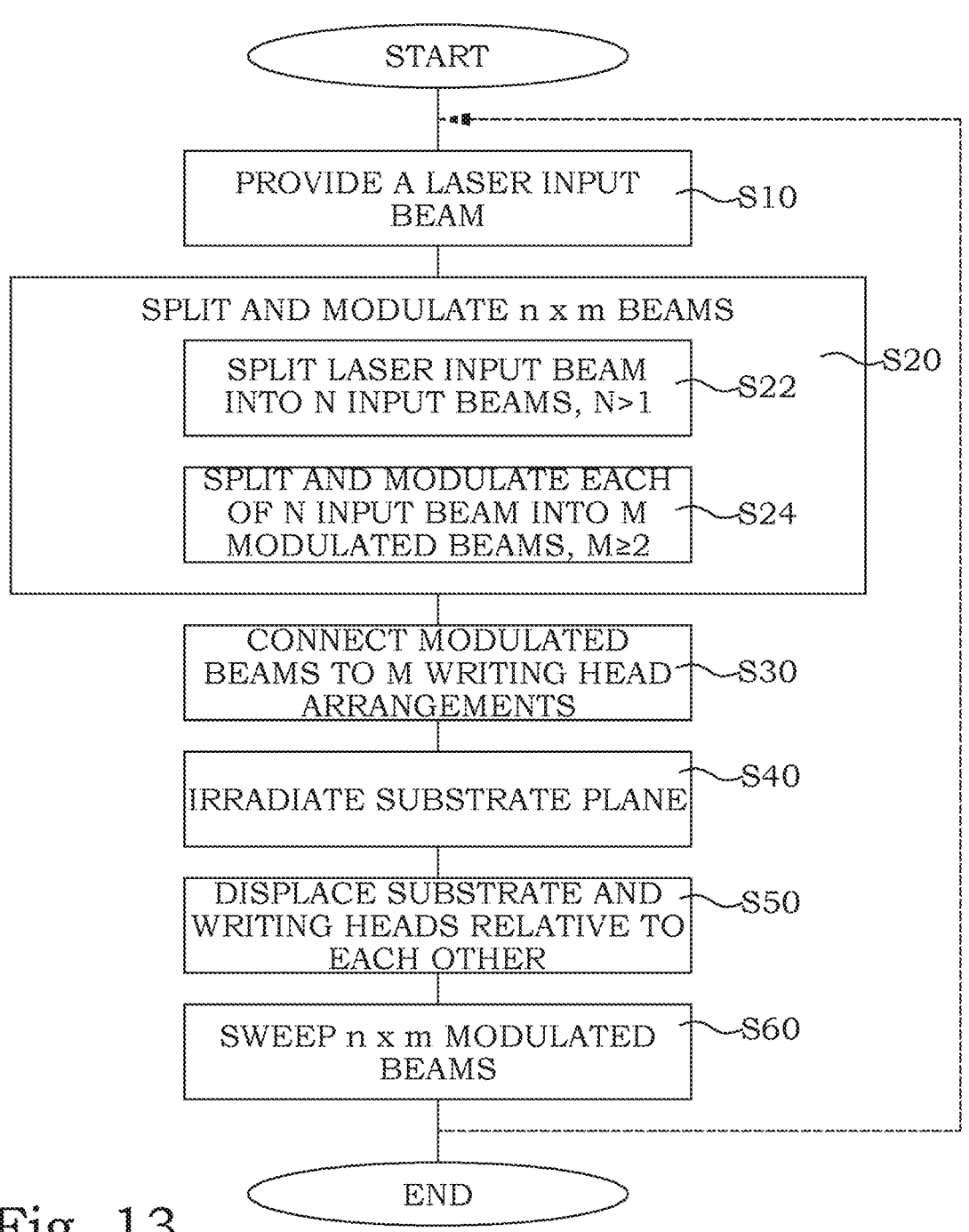
FIG. 13 is a flow diagram of steps of an embodiment of a method for operating a scanning lithographic laser writer.

FIG. 13 is a flow diagram of steps of an embodiment of a method for operating a scanning lithographic laser writer. In step S10, a laser input beam is provided. In step S20, the laser input beam is split and, by acoustic-optical modulation, modulated into n modulated beams, where n≥1. This is performed for each of m writing head arrangements, where m≥2. Preferably, the step of splitting and modulating the laser input beam is performed in n segment steps, wherein each segment step modulates one beam for each of the m writing head arrangements.

In one embodiment, where n>1, the step of splitting and modulating the laser input beam comprises the step S22 of splitting the laser input beam into n input beams. In step S24, each of the n input beams are split and modulated, by the acoustic-optical modulation, in a respective one of the segment steps.

In step S30, the n modulated beams for the m writing head arrangements are optically connected to the respective writing head arrangements. The n modulated beams exiting from each of the m writing head arrangements at all instances are displaced with a predetermined non-zero distance in the sweep direction with respect to each other. In step S40, a substrate plane of the scanning lithographic laser writer is irradiated by the n modulated beams for the m writing head arrangements. In step S50, the substrate plane and the m writing head arrangements are displaced relative to each other in at least a scan direction parallel to the substrate plane. In step S60, the n modulated beams exiting from the m writing head arrangements are swept in a sweep direction parallel to the substrate plane and transverse to the scan direction.

The different steps are illustrated in the Figure as consecutive steps. However, any person skilled in the art realizes that most of the steps are in practice performed simultaneously and repeatedly and in connection to each other, as indicated by the dotted arrow.

In one embodiment, the step S20 of splitting and modulating the laser input beam comprises driving the acousto-optical modulator by m transducers. Each of the m transducers is driven by a respective head-assigned frequency, different from the head-assigned frequencies of the other transducers.

In another embodiment, the step S20 of splitting and modulating the laser input beam comprises driving the acousto-optical modulator by one common transducer. The transducer is driven by a radio-frequency signal that is a sum of m radio-frequency signals, each having a respective different head-assigned frequency.

In a further embodiment, the driving of the acousto-optical modulator comprises modifying signals of the head-assigned frequencies for the acousto-optical modulator in each segment step for adapting an intensity of beams exiting the acoustic-optical crystal according to a predetermined print pattern in dependence of the step of sweeping the laser light exiting from the m writing head arrangements and the step of displacing the substrate holder and the m writing head arrangements relative to each other.

In one embodiment, the input laser beam for each segment step is provided as a single incident beam to the acousto-optical crystal. A radio-frequency bandwidth of the acousto-optical crystal enables diffracted beams associated with the m head-assigned frequencies. Preferably, this step comprises providing of the single incident beam to the acousto-optical crystal with an incident angle within the interval between a Bragg angle associated with a highest one of the head-assigned frequencies and a Bragg angle associated with a lowest one of the head-assigned frequencies.

In one embodiment, the input laser beam is split into m incident beams and the m incident beams are provided to the acousto-optical crystal in different incident angles. Preferably, the different incident angles correspond to respective Bragg angles associated with the head-assigned frequencies.

In all of the above embodiment, at least two modulated beams are provided in the diffraction direction of the acousto-optical crystal. A plurality of modulated beams may simultaneously also be separated in a direction perpendicular to the diffraction direction, one for each modulator segment. Thus, in a general description an array of n×m modulated beams are outputted simultaneously from the acousto-optical crystal, where n≥1 and m≥2. The m outputted modulated beams leaving the acousto-optical crystal in a same angle are intended for the same writer head arrangement.

In a preferred embodiment, the step of optically connecting the n modulated beams for each of the m writing head arrangements to the respective writing head arrangements comprises separating a bundle of parallel modulated beams from the acousto-optical modulator into m separate groups of n modulated beams, one group for each writing head arrangement.

Furthermore, in a preferred embodiment, the step of sweeping, described above, provides a synchronous sweeping for all writing head arrangements.

Figure 14:
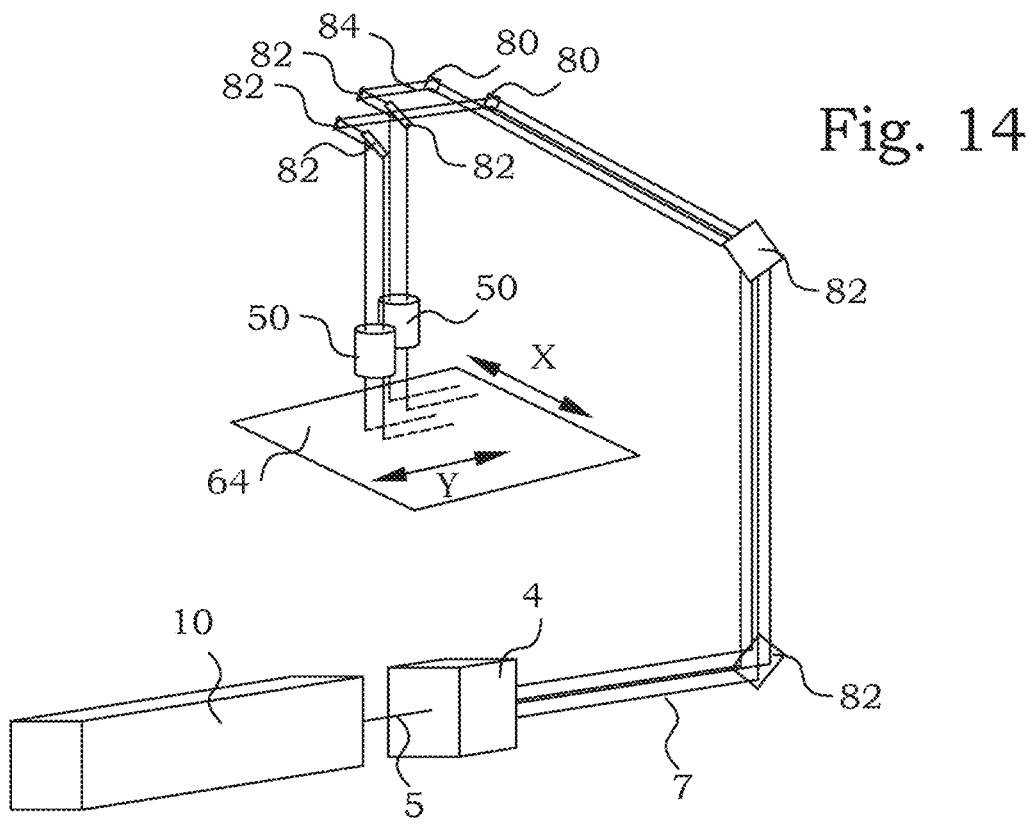
FIG. 14 illustrates schematically parts of an embodiment of an irradiation arrangement.

FIG. 14 illustrates schematically parts of an irradiation arrangement 2 serving for providing two different writing head arrangements 50 with two modulated laser beams 7 each. The laser source 10 provides the input beam 5 to the multi head modulator arrangement 4. Four modulated beams 7 are exiting the multi head modulator arrangement 4, two of which are intended for each writing head arrangements 50. The modulated beams 7 are led via a set of mirrors 82 to a respective writing head arrangement 50. Beam separators 80, in this particular embodiment in the shape of pick-up mirrors are arranged for reflecting only one pair of modulated beams in to separate bundles or groups. Different types of other optical means, not illustrated, may also be present in order to control the properties of the modulated beams. Such components are well-known by any person skilled in the art and is therefore not further described.

Thus, in a preferred embodiment, irradiation arrangement 2 further comprising a beam separator arranged for separating a bundle of parallel modulated beams from the acousto-optical modulator into m separate groups of n modulated beams, one group for each writing head arrangement.

The separate bundles or groups are arranged to have the same travelling distance to the respective writing head arrangement in order not to introduce any optical path differences between the bundles. At the exit of the multi head modulator arrangement 4, a lens, or lens system, is typically provided for the purpose of focusing the beams at a certain plane in the writing heads, being a plane conjugated to a pupil plane of a final lens. Since the same lens arrangement acts on the beams for all writing heads, the optical path has to be the same in order to maintain the focusing properties. This typically made by providing appropriate delay lines 84. Alternatively, a separate focusing lens arrangements is provided to each bundle of beams, after the separation for the different writing heads.

Each bundle of modulated beams 7 is provided to a writing head arrangement 50 so that the modulated beams 7 of each bundle is separated by a distance in the scan direction X at the laser-light sensitive surface 64. The writing head arrangements 50 are displaced with a non-zero distance in the sweep direction Y, and possibly also in the X direction.

The above illustration shows two writing head arrangements and two modulated beams per writing head arrangement. However, the number of frequencies and hence the number of diffracted beams can be significantly larger. Designs using 5-10 writing head arrangements are believed to be technologically possible. At the same time, the number of modulated beams per writing head arrangement may also differ and up to at least 15 modulated beams per writing head arrangement is perfectly technologically possible.

Figure 15:
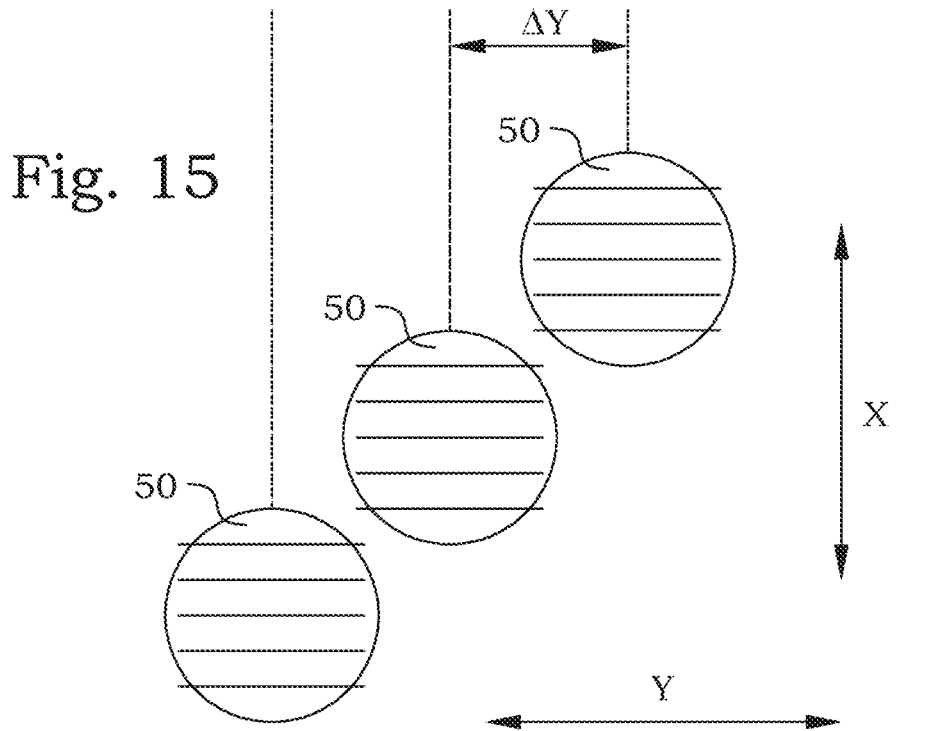
FIG. 15 illustrates geometrical relations of an embodiment of a plurality of writing head arrangements.

FIG. 15 illustrates schematically three writing head arrangements 50. Each writing head arrangement controls the sweep of five modulated beams (indicated as horizontal lines) separated in the scan direction X. The writing head arrangements 50 are offset in the sweep direction Y by an amount of ΔY. Typically, there is also an offset in the scan direction X between the writing head arrangements 50.

In a preferred embodiment, when m is larger than 1, the control unit is configured to controlling the sweep of laser light exiting from the m writing head arrangements to be synchronous. This facilitates the control logics, since the dependence of the scan movements then also becomes the same for all different writing head arrangements.

As all writing head arrangements preferably will be moving with the same speed in respect to the laser-light sensitive surface, the time of the sweep has to be the same for all heads. One way of achieving this is to use the same value of the pixelclock for all writing head arrangements.

This in turn requires that the strength of the cylindrical lens used for compensation of the astigmatism generated by the deflector RF frequency chirp will have to be tuned to the value of the pixelclock. This issue can be solved by a focal-length adjustable cylindrical lens.

The increase in writing speed that is available by the increase of the number of writing head arrangements can be utilized in different ways. The selected approach is connected to the predetermined non-zero distance of each of the writing head arrangements relative each other. The most straightforward utilization of the increased writing speed is to position the writing head arrangements displaced with an efficient sweep length. The sweeps of different scans may or may not overlap. An overlap between consecutive scans may be used e.g. for reducing any edge effects. The overlap, if any, may also be of different magnitude depending on how sensitive the pattern is for edge effects. The efficient sweep length is thereby defined as a sweep length of the writing head arrangements minus a sweep overlap distance. The sweep overlap distance is equal or larger than zero.

Figures 16A, 16B, 17A, 17B:
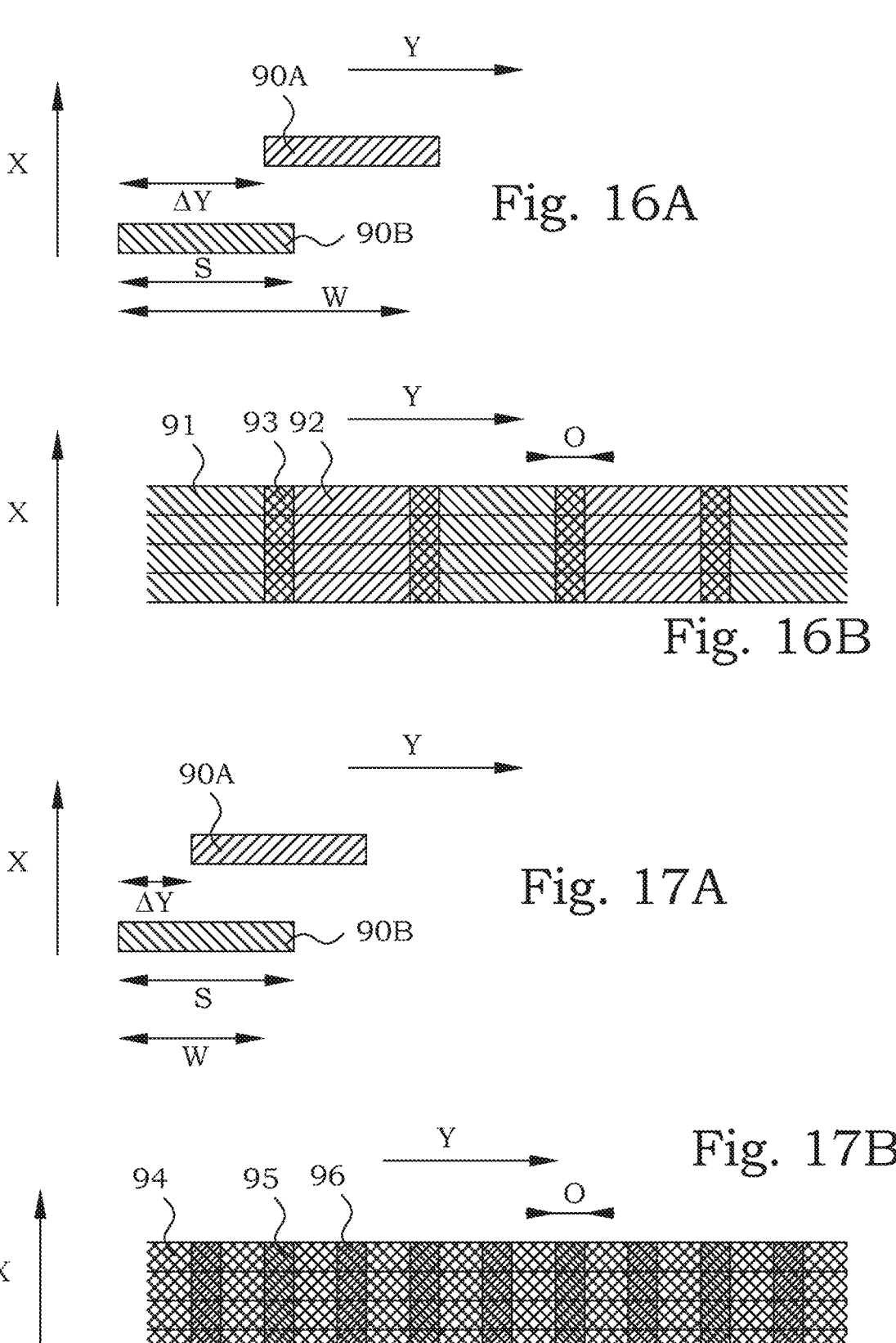
FIG. 16A illustrates schematically the exposure result of a sweep for an embodiment of writing head arrangements.
FIG. 16B illustrates the final exposure of the embodiment of FIG. 16A.
FIG. 17A illustrates schematically the exposure result of a sweep for another embodiment of writing head arrangements.
FIG. 17B illustrates the final exposure of the embodiment of FIG. 17A.

Such an approach, with two writing head arrangements, is illustrated in FIG. 16A. The exposures 90A, 90B from the two writing head arrangements for one entire sweep length S are displaced relative each other by a predetermined non-zero distance ΔY. When a next scan is to be made, the writing head arrangements are moved in the Y direction by a scan width distance W. The result after a complete set of scans is illustrated in FIG. 16B, where areas 91, 92 exposed by only one of the writing head arrangements are interleaved with overlap areas 93 with a sweep overlap distance O, where both writing head arrangements contribute to the exposure. In this embodiment it is seen that the predetermined non-zero distance ΔY is equal to the sweep length S minus the sweep overlap distance O.

In alternative arrangements, the increased writing speed may instead be used for improving exposure homogeneity. Lasers always have some variation in the intensity of the provided laser beam. Laser manufacturers do of course try to minimize any such variations, but there may still be minor fluctuations. Similarly, non-repetitive changes in the optical system may also contribute to that the laser intensity reaching the laser-light sensitive surface may differ somewhat from the intended intensity. Some of these fluctuations are fluctuations in time. If a same area at the laser-light sensitive surface is exposed at more than one time slot, so that the total exposure equals the requested exposure, the actual exposure will be the sum of the different part exposures. Any fluctuations in time of the laser intensity will thereby be averaged over the times of all exposures, and such an averaging will thereby reduce the impact of any time-fluctuating laser intensity.

FIG. 17A illustrates an embodiment with two writing head arrangements, where the predetermined non-zero distance ΔY between the writing head arrangements is equal to the efficient sweep length divided by 2. When a next scan is to be made, the writing head arrangements are moved in the Y direction by a scan width distance W. It can here be seen that each area at the laser-light sensitive surface will be exposed at least one time by each writing head arrangement. Instead, the scan width distance W becomes smaller, which increases the total writing time compared to the arrangement in FIG. 16A.

The result after a complete set of scans is illustrated in FIG. 17B, where areas 94 exposed once by each writing head arrangement are interleaved with overlap areas 95, 96, where one of the writing head arrangements has exposed twice and the other writing head arrangement has exposed once. An averaging of the intensities during these different exposures is thus obtained. The shortened distance between the overlap areas also reduces the risk for mura effects.

These principles can be generalized to more than two writing head arrangements. The different writing head arrangements may then be utilized either for increasing the actual writing speed or to improve the intensity averaging, as described above.

In other words, in one embodiment, the predetermined non-zero distance of each of the writing head arrangements relative one or two of the other writing head arrangements is equal to an efficient sweep length divided by an integer k, where k≤m.

In summary, the advantages of the present technology are many. One important advantage is that the printing speed of the writers will be increased proportionally to the amount of the writing head arrangements. Moreover, the quasi multiple pass strategy improves many of the critical lithographic parameters, such as placement, critical dimension uniformity (CDU) and mura.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A scanning lithographic laser writer, comprising:
a substrate holder having attachment means for holding a substrate with a laser-light sensitive surface in a substrate plane;
an irradiation arrangement, said irradiation arrangement having a laser source, said irradiation arrangement arranged for providing laser light from said laser source to irradiate said substrate plane, said irradiation arrangement further having a multi head modulator arrangement and m writing head arrangements, where m≥2, said irradiation arrangement arranged for providing said laser light from said laser source, via said multi head modulator arrangement to said m writing head arrangements to irradiate said substrate plane; and
a control unit, said control unit being configured for controlling a relative mechanical displacement between said substrate holder and said m writing head arrangements in at least one scan direction parallel to said substrate plane, said control unit being configured for controlling a sweep of laser light exiting from each of said m writing head arrangements in a sweep direction parallel to said substrate plane and transverse to said at least one scan direction,
wherein said multi head modulator arrangement is configured to split an input beam originating from said laser source into n beams, where n≥1, for each of said m writing head arrangements by use of an acousto-optical crystal, and wherein said multi head modulator arrangement is further configured to modulate said n beams simultaneously into n modulated beams, and
wherein said m writing head arrangements are positioned such that the laser light exiting from each of said m writing head arrangements becomes displaced with a predetermined non-zero distance in the sweep direction with respect to each other.

2. The scanning lithographic laser writer according to claim 1, wherein said multi head modulator arrangement comprises an acousto-optical modulator having n modulator segments, wherein each segment is configured to split and modulate the input beam originating from said laser source into one modulated beam for each of said m writing head arrangements.

3. The scanning lithographic laser writer according to claim 2, wherein each modulator segment of said acousto-optical modulator comprises m transducers.

4. The scanning lithographic laser writer according to claim 3, wherein said m transducers are driven by separate, respective head-assigned frequencies, wherein the separate, respective head-assigned frequencies are different from each other.

5. The scanning lithographic laser writer according to claim 4, wherein said multi head modulator arrangement comprises m beam-splitter arrangements, one for each modulator segment of said acousto-optical modulator, configured for splitting said input beam into m incident beams, said m incident beams being provided to said acousto-optical crystal in different incident angles relative to the acousto-optical modulator.

6. The scanning lithographic laser writer according to claim 3, wherein each transducer of said m transducers is driven by a radio-frequency signal being a sum of m radio-frequency signals, the m radio-frequency signals each having a respective different frequency, where the m radio-frequency signals of separate radio-frequency signals driving separate transducers of the m transducers have different frequency shifts.

7. The scanning lithographic laser writer according to claim 6, wherein said multi head modulator arrangement comprises m beam-splitter arrangements, one for each modulator segment of said acousto-optical modulator, configured for splitting said input beam into m incident beams, said m incident beams being provided to said acousto-optical crystal in different incident angles relative to the acousto-optical modulator.

8. The scanning lithographic laser writer according to claim 3, wherein said multi head modulator arrangement comprises m beam-splitter arrangements, one for each modulator segment of said acousto-optical modulator, configured for splitting said input beam into m incident beams, said m incident beams being provided to said acousto-optical crystal in different incident angles relative to the acousto-optical modulator.

9. The scanning lithographic laser writer according to claim 3, wherein said predetermined non-zero distance of each writing head arrangement of the m writing head arrangements relative to one or two other writing head arrangements of the m writing head arrangements is equal to an efficient sweep length divided by an integer k, where k≤m, and where said efficient sweep length is a sweep length of said m writing head arrangements minus a sweep overlap distance, said sweep overlap distance being equal to or larger than zero.

10. The scanning lithographic laser writer according to claim 2, wherein each modulator segment of said acousto-optical modulator comprises one transducer, wherein said one transducer is driven by a radio-frequency signal being a sum of m radio-frequency signals, each radio-frequency signal of the m radio-frequency signals having a respective different head-assigned frequency.

11. The scanning lithographic laser writer according to claim 10, wherein said multi head modulator arrangement comprises m beam-splitter arrangements, one for each modulator segment of said acousto-optical modulator, configured for splitting said input beam into m incident beams, said m incident beams being provided to said acousto-optical crystal in different incident angles relative to the acousto-optical modulator.

12. The scanning lithographic laser writer according to claim 2, wherein said predetermined non-zero distance of each writing head arrangement of the m writing head arrangements relative to one or two other writing head arrangements of the m writing head arrangements is equal to an efficient sweep length divided by an integer k, where k≤m, and where said efficient sweep length is a sweep length of said m writing head arrangements minus a sweep overlap distance, said sweep overlap distance being equal to or larger than zero.

13. The scanning lithographic laser writer according to claim 2, further comprising a beam separator arranged for separating a bundle of parallel modulated beams from said acousto-optical modulator into m separate groups of n modulated beams, one group for each writing head arrangement.

14. The scanning lithographic laser writer according to claim 1, wherein said predetermined non-zero distance of each m writing head arrangement of the m writing head arrangements relative to one or two other writing head arrangements of the m writing head arrangements is equal to an efficient sweep length divided by an integer k, where k≤m, and where said efficient sweep length is a sweep length of said m writing head arrangements minus a sweep overlap distance, said sweep overlap distance being equal or larger than zero.

15. A method for operating a scanning lithographic laser writer, the method comprising:

providing a laser input beam;

splitting said laser input beam into n beams and, by acoustic-optical modulation, modulating said n beams simultaneously into n modulated beams, where n≥1, for each of m writing head arrangements, where m≥2;

optically connecting said n modulated beams to respective writing head arrangements of the m writing head arrangements;

irradiating a substrate plane of said scanning lithographic laser writer by said n modulated beams for said m writing head arrangements;

displacing said substrate plane and said m writing head arrangements relative to each other in at least a scan direction parallel to said substrate plane; and sweeping said n modulated beams exiting from said m writing head arrangements in a sweep direction parallel to said substrate plane and transverse to said scan direction, whereby said n modulated beams exiting from each of said m writing head arrangements at all instances are displaced with a predetermined non-zero distance in the sweep direction with respect to each other.

16. The method according to claim 15, wherein the splitting and the modulating is performed in n segment steps, wherein each segment step modulates one beam for each of said m writing head arrangements.

17. The method according to claim 16, wherein the splitting and the modulating comprises driving an acousto-optical modulator by m transducers.

18. The method according to claim 17, wherein said m transducers are driven by separate, respective head-assigned frequencies, wherein the separate, respective head-assigned frequencies are different from each other.

19. The method according to claim 17, wherein each transducer of said m transducers is driven by a radio-frequency signal being a sum of m radio-frequency signals, the m radio-frequency signals each having a respective different frequency, where the m radio-frequency signals of separate radio-frequency signals driving separate transducers of the m transducers have different frequency shifts.

20. The method according to claim 16, wherein the splitting and the modulating comprises driving an acousto-optical modulator by one transducer, wherein said one transducer is driven by a radio-frequency signal being a sum of m radio-frequency signals, each radio-frequency signal of the m radio-frequency signals having a respective different head-assigned frequency.

* * * * *